(12) United States Patent
Sanchez et al.

(10) Patent No.: US 6,188,267 B1
(45) Date of Patent: Feb. 13, 2001

(54) NORMALLY CONDUCTING DUAL THYRISTOR

(75) Inventors: Jean-Louis Sanchez, Escalquens; Jean Jalade, Castanet-Tolosan; Jean-Pierre Laur, Albi; Henri Foch, Toulouse, all of (FR)

(73) Assignee: Centre National de la Recherche Scientifique, Paris (FR)

( * ) Notice: Under 35 U.S.C. 154(b), the term of this patent shall be extended for 0 days.

(21) Appl. No.: 09/091,135
(22) PCT Filed: Oct. 3, 1997
(86) PCT No.: PCT/FR97/01756
§ 371 Date: Apr. 15, 1999
§ 102(e) Date: Apr. 15, 1999
(87) PCT Pub. No.: WO98/15982
PCT Pub. Date: Apr. 16, 1998

(30) Foreign Application Priority Data

Oct. 4, 1996 (FR) .................................. 96 12323

(51) Int. Cl.[7] ...................................................... H03K 17/72
(52) U.S. Cl. ........................... 327/438; 327/439; 257/133; 257/132
(58) Field of Search ................................... 327/438, 441, 327/439, 464, 442; 257/133, 132

(56) References Cited

U.S. PATENT DOCUMENTS 5,349,212 * 9/1994 Seki ..................................... 257/133

* cited by examiner

Primary Examiner—Dinh T. Le
(74) Attorney, Agent, or Firm—Arthur L. Plevy; Buchanan Ingersoll PC

(57) ABSTRACT

The present invention relates to a component forming a normally on dual thyristor, which can be turned off by a voltage pulse on the control electrode, including a thyristor, a first depletion MOS transistor, the gate of which is connected to the source, connected between the anode gate and the cathode of the thyristor, and a second enhancement MOS transistor, the gate of which is connected to a control terminal.

8 Claims, 3 Drawing Sheets

NORMALLY CONDUCTING DUAL THYRISTOR

BACKGROUND OF THE INVENTION

1. Field of the Invention

The present invention relates to a dual thyristor, that is, to a component, the features of which can be induced from those of a conventional thyristor by applying the duality principle to the current and voltage behaviors and to the control modes.

2. Discussion of the Related Art

FIG. 1A shows a conventional thyristor Th including an anode A, a cathode K, and cathode and anode gates GK and GA.

The characteristic curve of a thyristor is illustrated in FIG. 1B. This component exhibits the following features:

it is normally off, it is a one-way component for the current, that is, it is likely to let through a positive current $I_A$ but blocks a negative current, it is bidirectional for the voltage, that is, it is likely to withstand positive or negative voltages in the off state, it can be triggered by a current pulse applied to its gate when the voltage thereacross is positive; this is illustrated in FIG. 1B by curve 10, that is, when a gate current is applied thereto, it turns on by break over, and its characteristic becomes that indicated by curve 11, it is self-triggering when the voltage thereacross exceeds a value VBO in the absence of a gate current, it spontaneously turns off when the current flowing therethrough becomes low (lower than a hold current value $I_H$).

The symbol of a dual thyristor is illustrated in FIG. 2A. This dual thyristor has current-voltage characteristics which are dual with respect to those of a conventional thyristor, as is shown in FIG. 2B:

it is normally on, it is bidirectional for the current, that is, a positive current as well as a negative current can flow therethrough (the flowing of a negative current is ensured by diode D illustrated in FIG. 2A), it is a one-way component for the voltage, that is, it is likely to withstand positive voltages only, in the off state, due to the presence of diode D, it can be turned off by a voltage pulse applied to the gate, that is, if, while the operating point is on curve 20, a control voltage is applied, the operating characteristic will become that designated with reference 21, it has a self turn-off characteristic, that is, if the current flowing therethrough exceeds a value $I_{BO}$, it turns off by itself, it spontaneously triggers at voltage zero crossing, that is, it turns on if, while in the off state, the voltage thereacross drops below a threshold voltage $V_H$.

In other words, while a thyristor forms a normally off one-way component for the current, which can be triggered by a control current or be self-triggering beyond a given voltage threshold, a dual thyristor forms a normally on switch which can be turned off by a control voltage or be self-locking beyond a given voltage threshold.

In prior art, the implementation of a system having the function of a dual thyristor has been performed by associating a specific control circuit with a switching component. This solution has two disadvantages. The first one is that it is always difficult to monolithically associate control circuits with a power component. The second one is that it is necessary to provide for the control circuit a bulky auxiliary power supply, which is costly and possibly sensitive to surrounding disturbances. A simplified dual thyristor not controllable by pulses is described in EPE'95: 6TH European Conference on Power Electronics and Application, Seville, Sep. 19–21, 1995, vol. 1, Sep. 19, 1995, P. 1.637 to 1.642, X P OOO537596, J-L Sanchez et al.

SUMMARY OF THE INVENTION

Thus, an object of the present invention is to provide a simple assembly of components having the function of a dual thyristor.

Another object of the present invention is to provide such an assembly in the form of a monolithic component.

Another object of the present invention is to provide such a monolithic component which can be manufactured by usual technologies.

To achieve these objects as well as others, the present invention provides a component forming a dual thyristor, which is normally on and which can be turned off by a voltage pulse on the control electrode, including a thyristor, a resistive means formed of a first depletion MOS transistor, the gate of which is connected to the source, the substrate of this transistor being connected to the cathode gate terminal, connected between the anode gate and the thyristor cathode, and a controlled conduction switching means formed of a second enhancement MOS transistor, the gate of which is connected to a control terminal and the substrate of which is connected to the cathode gate terminal, connected between the cathode gate and the thyristor cathode.

According to an embodiment of the present invention, the component is pulse-controlled and further includes means for maintaining the conduction between the cathode gate and the cathode as soon as this conduction has been triggered by the switching means.

According to an embodiment of the present invention, the maintaining means include a third enhancement MOS transistor, the substrate of which is connected to the cathode gate terminal, in parallel on the second enhancement MOS transistor; a zener diode connected between the cathode of the thyristor and a node connected to the gate of the third transistor; and a fourth depletion MOS transistor connected between said node and the anode gate of the thyristor, the gate of the fourth transistor being connected to the cathode and its substrate being connected to said node.

According to an embodiment of the present invention, a low leakage current component is made by providing, in series with the first depletion MOS transistor, a second switching means, normally on and turned off after a control order has been applied to the second transistor.

According to an embodiment of the present invention, the second switching means is a floating substrate P-channel depletion MOS transistor, the gate of which is connected to said node.

According to an embodiment of the present invention, the thyristor is implemented in vertical form in a silicon substrate of a first conductivity type; the first depletion MOS transistor is implemented between the cathode region of the thyristor and the substrate; each of the second and third MOS enhancement transistors is formed between two regions of the first conductivity type formed in a first cathode gate well of the thyristor, one of these two regions corresponding to the cathode region of the thyristor; the fourth depletion MOS transistor is formed between a region of the first conductivity type, itself formed in a second well of the second conductivity type separated from the gate well of the thyristor, and the substrate; and the zener diode is formed in the second well.

According to an embodiment of the present invention, the component is formed from a substrate of the first conductivity type, the rear surface of which is coated with a layer of the second conductivity type coated with a first metallization and includes on its front surface side a first well of the second conductivity type containing first, second, third and fourth regions of the first conductivity type, the first and second regions being separated by a portion of the first well coated with a first insulated gate metallization, the third and fourth regions being separated by a portion of the first well coated with a second insulated gate metallization, a portion at least of the first well separating the first and/or the fourth region from the substrate including at its upper surface a first preformed channel region coated with a third insulated gate metallization, a second metallization coating the first region, a third metallization coating the second and third regions and a portion of the upper surface of the first well, a fourth metallization coating the fourth region; and a second well of the second conductivity type including fifth and sixth regions of the first conductivity type, the fifth region being separated from the substrate by a second preformed channel region coated with a fourth insulated gate metallization, the sixth region forming with the second well a zener junction, a fifth metallization coating the fifth and sixth regions and connecting them to the second well, a sixth metallization being in contact with a portion of the second well, a sixth metallization being in contact with a portion of the second well neighboring the sixth region. The second insulated gate metallization is meant to be connected to a control terminal; the second, fourth, and sixth metallizations as well as the third and fourth insulated gate metallizations are meant to be connected to a cathode terminal, the fifth metallization being connected to the first insulated gate metallization.

According to an embodiment of the present invention, the thyristor is implemented in vertical form in a silicon substrate of a first conductivity type; the first depletion MOS transistor is formed in a third well separated from the first cathode gate well of the thyristor, between a region formed in this third well and the substrate; each of the second and third enhancement MOS transistors is formed between a region of the first conductivity type, formed in the cathode gate well of the thyristor, and the cathode region of the thyristor; the fourth depletion MOS transistor is formed between a region of the first conductivity type, itself formed in a second well of the second conductivity type separated from the gate well of the thyristor, and the substrate; the zener diode is formed in the second well; and the fifth P-channel depletion MOS transistor is formed between the second well and an additional region of the second conductivity type.

According to an embodiment of the present invention, the component is formed from a substrate of the first conductivity type, the rear surface of which is coated with a layer of the second conductivity type coated with a first metallization and includes, on its front surface side, a first well of the second conductivity type containing first, second, and third regions of the first conductivity type, the first and second regions being separated by a portion of the first well coated with a first insulated gate metallization, the first and third regions being separated by a portion of the first well coated with a second insulated gate metallization, the first region being coated with a second metallization, the second region being coated with a third metallization extending over a portion of the first well, the third region being coated with a fourth metallization extending over a portion of the first well; a second well of the second conductivity type including fourth and fifth regions of the first conductivity type, the fourth region being separated from the substrate by a first preformed channel region coated with a third insulated gate metallization, the fifth region forming with the second well a zener junction, a fifth metallization coating the fourth and fifth regions and connecting them to the second well, a sixth metallization being in contact with a portion of the second well neighboring the fifth region; and a third well of the second conductivity type containing a sixth region of the first conductivity type, a portion at least of the well separating the sixth region from the substrate including at its upper surface a second preformed channel region coated with a fourth insulated gate metallization, the third well being separated from a region of the second conductivity type by a lightly-doped region of the second conductivity type coated with a fifth insulated gate metallization, the sixth region and a portion of the upper surface of the third well being coated with a seventh metallization, the upper surface of the lightly-doped region of the second conductivity type being coated with an eighth metallization. The first insulated gate metallization is meant to be connected to a control terminal; the second, sixth, and eighth metallizations as well as the third and fourth insulated gate metallizations are meant to be connected to a cathode terminal, the fifth metallization being connected to the second and fifth insulated gate metallizations.

According to an embodiment of the present invention, each of the wells includes more heavily-doped areas at least at the locations where a metallization is in contact with a portion of their upper surface.

The foregoing objects, features and advantages of the present invention will be discussed in detail in the following non-limiting description of specific embodiments in connection with the accompanying drawings.

DETAILED DESCRIPTION

Figure 1A:
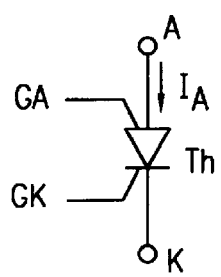
FIGS. 1A and 1B show a thyristor and its current-voltage characteristic.
Figure 1B:
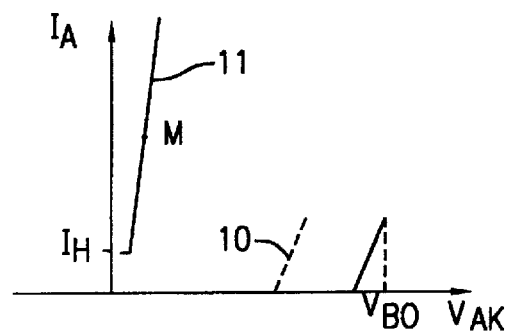
Figure 2A:
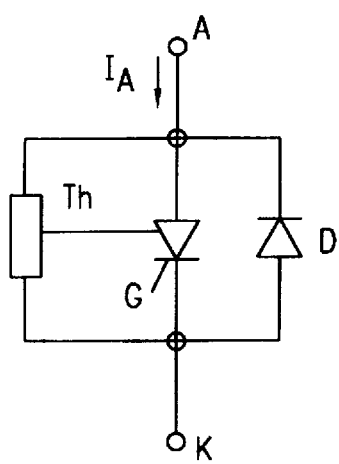
FIGS. 2A and 2B show a dual thyristor and its current-voltage characteristic.
Figure 2B:
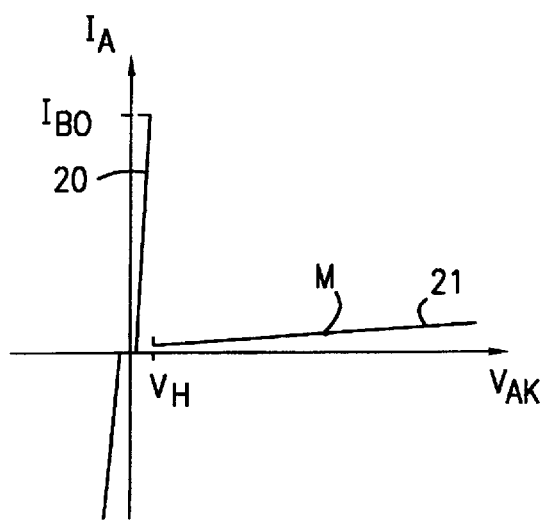
Figure 3A:
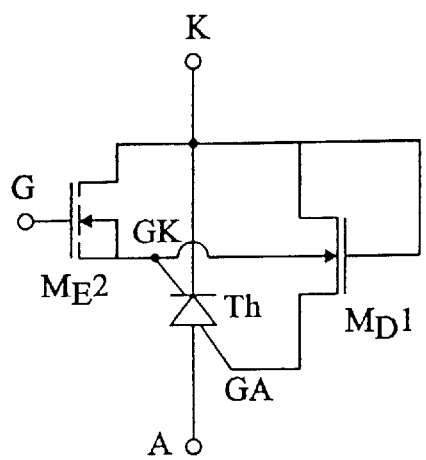
FIGS. 3A and 3B show a first example of a circuit forming a dual thyristor according to the present invention.

FIG. 3A shows a first embodiment of a dual thyristor according to the present invention. This dual thyristor is built from a thyristor Th having an anode terminal A, a cathode terminal K, a cathode gate terminal GK and an anode gate terminal GA. Terminal GA is connected to terminal K via a depletion N-channel MOS transistor $M_D1$. The gate of transistor $M_D1$ is also connected to terminal K.

Terminal GK is connected to terminal K via an enhancement N-channel MOS transistor $M_E2$. The drain of transistor $M_E2$, connected to terminal GK, is also connected to the substrate of transistor $M_E2$. The gate of transistor $M_E2$ is connected to a control terminal G. The substrates of transistors $M_D1$ and $M_E2$ are connected to terminal GK.

The operation of this circuit is the following. As soon as anode-cathode voltage $V_{AK}$ increases positively, an anode gate current flows from terminal A to terminal K through anode gate GA and transistor $M_D1$ which is normally on. Accordingly, thyristor Th turns on and acts as a closed switch.

To turn off thyristor Th, a voltage which is positive with respect to the cathode has to be applied on gate terminal G of transistor $M_E2$. Transistor $M_E2$ then short-circuits the cathode and the cathode gate of the thyristor and turns it off.

A normally on component controlled to be turned off has thus been obtained. However, if the control voltage on terminal G is interrupted, the component turns back on.

Further, to form a bidirectional dual thyristor for the current, a diode D is connected by its anode to terminal K and by its cathode to terminal A. This diode has not been shown for simplicity, neither in this drawing, nor in the following drawings.

Figure 3B:
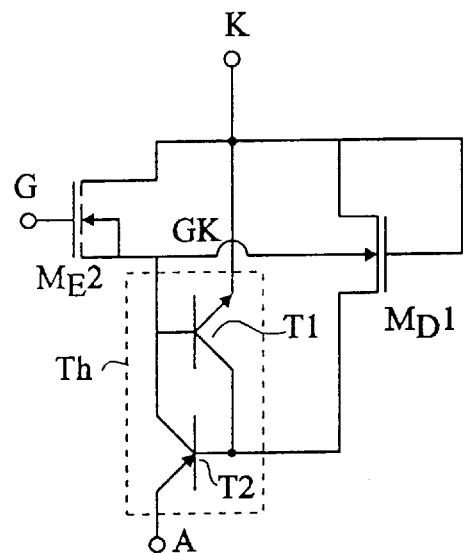

FIG. 3B reproduces the circuit of FIG. 3A. Thyristor Th has been conventionally shown by its two equivalent transistors T1 and T2. This equivalent diagram could be used each time a thyristor has been shown.

Figure 4:
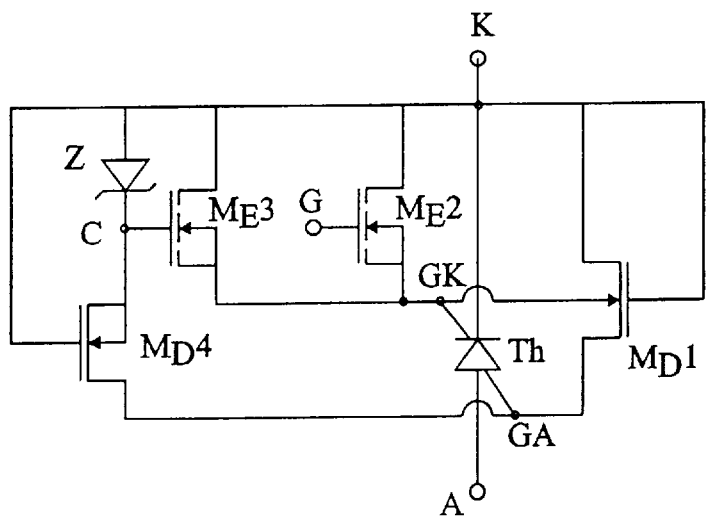
FIG. 4 shows a second example of a circuit forming a dual thyristor according to the present invention.

FIG. 4 shows a modification of the circuit of FIG. 3A enabling to control the component with pulses, that is, the component is set to the off state by a control pulse, then remains off while the voltage thereacross remains positive, even if no control signal is maintained.

Elements Th, $M_D1$, and $M_E2$ described in relation with FIG. 3A reappear in FIG. 4. Further, an enhancement MOS transistor $M_E3$ is connected in parallel, by its main terminals, on transistor $M_E2$. The gate of transistor $M_E3$ is connected to a node C. Node C is connected to the cathode of a zener diode Z, the anode of which is connected to terminal K. Node C is also connected to terminal GA via a depletion N-channel MOS transistor $M_D4$, the gate of which is connected to terminal K. Each of transistors $M_E3$ and $M_D4$ has its source connected to its substrate.

The turning-on of thyristor Th is ensured as previously by depletion MOS transistor $M_D1$. Once a turn-off order is applied on gate terminal G of transistor $M_E2$, the voltage on terminal A and thus on terminal GA increases with respect to the voltage on terminal K. The voltage on terminal GA reappears via transistor $M_D4$ on node C, that is, on the gate of transistor $M_E3$. Transistor $M_E3$ turns on and maintains the short-circuit state between the cathode and the cathode gate of thyristor Th, even if the control on gate G is interrupted. Zener diode Z is used to limit the gate voltage of transistor $M_E3$.

Thus, the dual thyristor of FIG. 4 can effectively be controlled to be turned off by a pulse on terminal G and remains off as long as the voltage on terminal C remains higher than the threshold voltage of transistor $M_E3$, that is, substantially as long as voltage $V_{AK}$ is higher than the threshold voltage of transistor $M_E3$.

The circuit of FIG. 4 has a disadvantage in that, in the off state, there remains a leakage current through depletion transistor $M_D1$. To limit this leakage current, the resistance in the on state of transistor $M_D1$ should be increased, which would have disadvantages as concerns the sensitivity of the initial turning-on of the dual thyristor.

Figure 5:
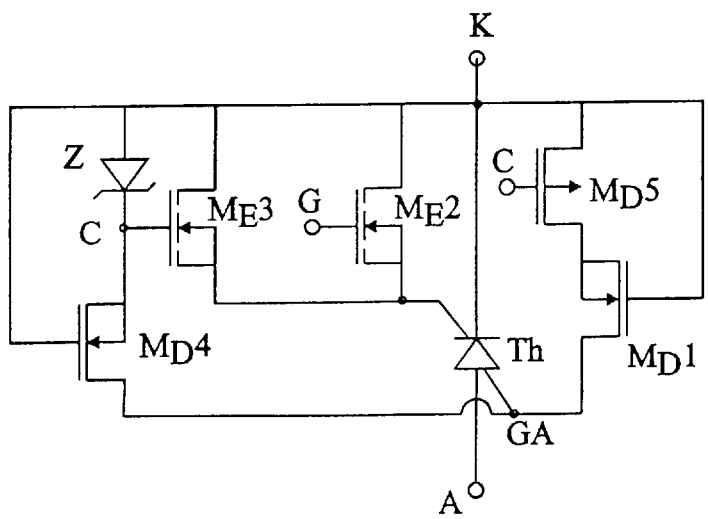
FIG. 5 shows a third example of a circuit forming a dual thyristor according to the present invention.

To overcome this disadvantage, according to an alternative of the present invention, it is provided to arrange in series with transistor $M_D1$ a switch which is opened when the device switches to the off state. FIG. 5 shows an example of implementation of such a structure suppressing the off-state leakage current.

The circuit of FIG. 5 is identical to that of FIG. 4 with the addition of a floating substrate depletion P-channel MOS transistor $M_D5$ in series with transistor $M_D1$ between terminals GA and K. The gate of transistor $M_D5$ is connected to node C.

Thus, when the anode-cathode voltage becomes positive from a zero value, depletion MOS transistors $M_D1$ and $M_D5$ are both on and trigger thyristor Th. When the device is off, as has been described in relation with FIG. 4, the increase of the potential on node C turns off transistor $M_D5$. A substantially total canceling of the leakage current is thus obtained.

In the foregoing description, the self turn-off function when the current through the dual thyristor exceeds a determined threshold has not been described. Indeed, this feature is seldom useful in practical applications. It however exists in the embodiments of FIGS. 4 and 5 and intervenes when the current through thyristor Th induces therein a voltage drop higher than the sum of the threshold voltage of transistor $M_E3$ and of the saturation voltage of transistor $M_D4$.

Figure 6:
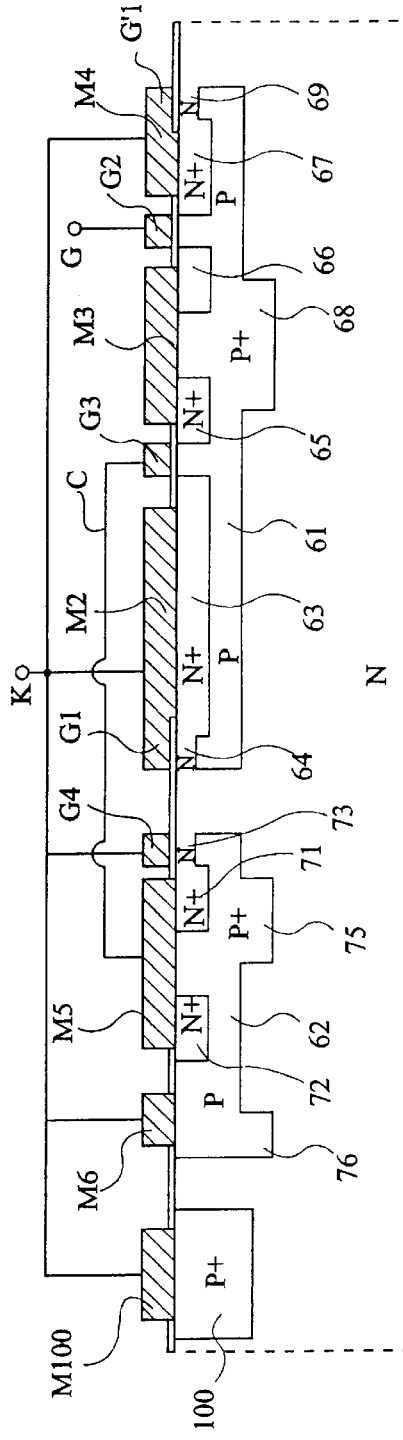
FIG. 6 shows a simplified cross-sectional view of a semiconductor component implementing the functions of the circuit of FIG. 4.
Figure 7:
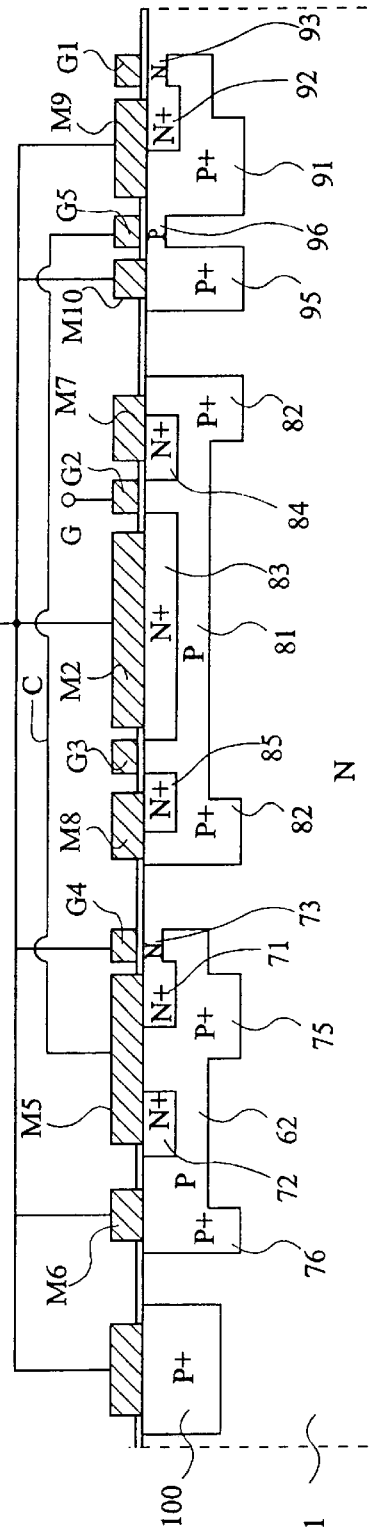
FIG. 7 shows a simplified cross-sectional view of a semiconductor component implementing the functions of the circuit of FIG. 5.

FIGS. 6 and 7 very schematically show simplified cross-sectional views of monolithic semiconductive structures respectively implementing the circuits of FIGS. 4 and 5.

As is usual in the field of the representation of semiconductor components, the several layers and regions of these structures are not drawn to scale but their dimensions have been arbitrarily modified to improve the readability and facilitate the drawings.

The shown structures are formed from a lightly-doped N-type substrate 1, the rear surface of which is coated with a P$^+$-type layer 2 uniformly coated with an anode metallization M1. It should be noted that, if it is desired to provide the structure with an antiparallel diode, it could be provided to partially interrupt P$^+$-type region 2 and to diffuse, instead, an N$^+$-type region in front of a P$^+$-type region formed on the upper surface side, as is indicated in the left-hand portion of FIGS. 6 and 7.

In FIG. 6, on the upper surface side, four types of regions are to be found:

heavily-doped P-type regions (P$^+$),
more lightly-doped P-type regions (P),
heavily-doped N-type regions (N$^+$), and
more lightly-doped N-type regions corresponding to the preformed channels of depletion N-channel MOS transistors.

FIG. 7 further shows a lightly-doped P-type region 96 meant to form the preformed channel of the floating substrate depletion P-channel MOS transistor $M_D5$.

In FIG. 6, two P-type wells 61 and 62 are formed on the upper surface side of the substrate.

In well 61, an N$^+$-type region 63 forms the cathode region of thyristor Th. A portion 64 of well 61, intermediary between region 63 and an upper portion of substrate 1, is replaced with a lightly-doped N-type region forming a preformed channel for transistor $M_D1$. This region 64 is coated with an insulated gate metallization G1. Metallization G1 may be formed of an extension of a metallization M2 coating region 63 and forming the cathode metallization of the thyristor.

In well 61, between region 63 and another N+-type region 65 is formed an enhancement N-channel MOS transistor, the channel region of which is coated with an insulated gate metallization G3. This transistor corresponds to transistor $M_E3$ of FIG. 4.

In well 61, enhancement MOS transistor $M_E2$ is also formed between N+-type regions 66 and 67. The gate of this transistor is designated with reference G2. A metallization M3 is in contact with the upper surfaces of regions 65 and 66 and with a P+ overdoped region 68 of well 61. A metallization M4 covers region 67. Metallization M4 is connected to terminal K and, as an example of an alternative of the present invention, an extension of this metallization M4 forming a gate G'1 of another portion of depletion transistor $M_D1$ above a lightly-doped N-type region 69 extending between region 67 and an upper surface portion of substrate 1 has been shown.

In well 62 are formed N+-type regions 71 and 72. A preformed channel region 73 extends at the upper surface of the component between region 71 and an upper portion of substrate 1. This channel is coated with an insulated gate G4. A metallization M5 covers the upper portion of region 71, an apparent surface of an overdoped region 75 of well 62, and the upper surface of region 72. A metallization M6 is in contact with an apparent overdoped portion 76 of well 62. Metallization M5 is connected to metallization G3 which corresponds to terminal C. Metallization M6 is connected to cathode gate K.

To properly understand how the structure of FIG. 6 corresponds to the circuit of FIG. 4, it should be noted that well 61 corresponds to cathode gate GK of thyristor Th and that substrate 1 corresponds to its anode gate GA. Thus:

thyristor Th includes, between metallizations M1 and M2, regions 2-1-61-63;

transistor $M_D1$ has a source 63 (67) connected to terminal K by metallization M2 (M4), a gate G1 (G'1) connected to cathode K, and a drain which corresponds to substrate 1; the substrate of this transistor $M_D1$ corresponds to well 61, that is, to terminal GK;

transistor $M_E2$ has a drain 66 which is connected by metallization M3 to region 61, which corresponds to the substrate of transistor $M_E2$ and to terminal GK; its gate G2 is connected to a control terminal G; and its source 67 is connected by metallization M4 to terminal K;

transistor $M_E3$ has, as a source, region 63 confounded with the cathode region of the thyristor, and as a drain, region 65 connected by metallization M3 to its substrate which also is area 68 corresponding to a portion of cathode gate layer 61;

transistor $M_D4$ has, as a source, region 71 connected by metallization M5 to the substrate of this transistor and to node C and has, as a drain, substrate 1;

zener diode Z corresponds to the junction between well 62 and region 72. Its cathode corresponds to region 72 and is connected by metallization M5 to node C. Its anode corresponds to an overdoped region 76 of well 62 and is connected by metallization M6 to terminal K.

Further, as has been previously indicated, an antiparallel diode is formed between a P+ region 100 coated with a metallization M100 on the upper surface side and an N+ region 101 coated with metallization M1 on the lower surface side.

It should be noted that this structure is likely to have a great number of alternative modes of implementation, provided that the functions described hereabove of a thyristor, of four MOS transistors and of a zener diode are implemented.

Moreover, in the above description of an example of monolithic integration of the circuit of FIG. 5, alternative implementations have been provided for several elements. Further, the metallizations schematically shown as connected by wires to terminal K or to node C can be formed of one and the same metallization if the topological considerations enable it.

FIG. 7 shows an embodiment of the circuit of FIG. 5.

The left-hand portion of FIG. 7 shows wells and regions 62, 71, 72, 73, 75, 76 identical to what is shown in FIG. 6 and coated with metallizations M6, M5, and G4. This assembly forms, as in FIG. 6, an implementation of transistor $M_D4$ and of diode Z.

The central portion of FIG. 7 shows a P-type well 81, the periphery of which is formed of a more heavily-doped P+-type region 82. In this well, a main N+-type region 83 forms the thyristor cathode and is coated with a metallization M2. Two wells 84 and 85 form the drains of transistors $M_E2$ and $M_E3$ and are separated from region 83 by portions of well 81 coated with insulated gate metallizations G2 and G3. Metallization G2 is connected to a control gate G. Metallization G3 is connected to node C. Region 84 and a portion of overdoped region 82 of the well are coated with a metallization M7 corresponding to the source-substrate connection of transistor $M_E2$ and to a connection between this source and well 81 which corresponds to the cathode gate of the thyristor. Similarly, region 85 is connected to a portion of region 82 by a metallization M8.

The right-hand portion of FIG. 7 shows a P+-type well 91 in which is formed an N+-type region 92. A lightly-doped N-channel preformed channel region 93 extends between region 92 and an upper portion of substrate 1. This preformed channel region is coated with an insulated gate G1 connected to cathode K. A metallization M9 connects the apparent surfaces of regions 91 and 92. Further, in the immediate vicinity of heavily-doped P-type region 91 is formed a heavily-doped P-type region 95. Regions 91 and 95 are separated by a lightly-doped P-type preformed channel region 96 and region 95 is coated with a metallization M10 connected to cathode K.

This structure thus comprises:

a thyristor Th formed of regions 2-1-81-83 between metallizations M1 and M2 (terminals A and K), a MOS transistor $M_D1$, the source of which corresponds to region 92, the drain of which corresponds to substrate 1, and the gate of which corresponds to metallization G1, a MOS transistor $M_E2$, the source of which corresponds to region 83, the drain of which corresponds to region 84, and the gate of which corresponds to metallization G2, a MOS transistor $M_E3$, the source of which corresponds to region 83, the drain of which corresponds to region 85, the gate of which corresponds to metallization G3, and the substrate of which corresponds to region 81, a MOS transistor $M_E4$ identical to that of FIG. 6, a zener diode Z identical to that of FIG. 6, a floating substrate depletion P-channel MOS transistor $M_D5$, the source of which corresponds to region 91, the drain of which corresponds to region 95, the gate of which corresponds to metallization G5, and the substrate of which corresponds to substrate 1.

Of course, the present invention is likely to have various alterations, modifications and improvements which will readily occur to those skilled in the art. The improvements usually brought to thyristors (emitter short-circuits) may be used. Channel stop regions and regions of insulation between components may also be provided.

What is claimed is:

1. A component forming a dual thyristor, which is normally on and which can be turned off by a voltage pulse on a control electrode, including:

a thyristor (Th) having a cathode (K), an anode, a cathode gate (GK) and an anode gate (GA), resistive means formed of a first depletion MOS transistor ($M_D1$) having a drain, a source, a gate and a substrate, the gate being connected to the source, the substrate being connected to the cathode gate terminal, said first transistor being connected between the anode gate (GA) and the cathode (K), and a controlled switching means formed of a second enhancement MOS transistor ($M_E2$) having a drain, a source, a gate and a substrate, the gate being connected to a control terminal (G) and the substrate being connected to the cathode gate (GK) terminal, said second transistor being connected between the cathode gate (GK) and the cathode (K), and, maintaining means for maintaining conduction between the cathode gate and cathode in response to said switching means comprising:

a third enhancement MOS transistor ($M_E3$) having a gate, a source, a drain and a substrate, the substrate of which is connected to the cathode gate terminal (GK), in parallel with the second transistor ($M_E2$);

a zener diode (Z) connected between the cathode of the thyristor and a node (C) connected to the gate of the third transistor ($M_E3$); and a fourth depletion MOS transistor ($M_D4$) having a gate, a source, a drain and a substrate and connected between said node (C) and the anode gate of the thyristor, the gate of the fourth transistor being connected to the cathode (K) and its substrate being connected to said node (C).

2. The component of claim 1, including, in series with the first depletion MOS transistor ($M_D1$), a second switching means, normally on and turned off after a control order has been applied to the second transistor ($M_E2$).

3. The component of claim 2, wherein the second switching means is a floating substrate P-channel depletion MOS transistor ($M_D5$), the gate of which is connected to said node (C).

4. The component of claim 1, wherein:

the thyristor (Th) is implemented in vertical form in a silicon substrate (1) of a first conductivity type;

the first depletion MOS transistor ($M_D1$) is implemented between a cathode region (63) of the thyristor and the substrate;

each of the second and third enhancement MOS transistors ($M_E2$, $M_E3$) is formed between two regions (63, 65; 66, 67) of the first conductivity type formed in a first cathode gate well (61) of the thyristor, one of these two regions (63; 67) corresponding to the cathode region of the thyristor;

the fourth depletion MOS transistor ($M_D4$) is formed between a region of the first conductivity type (71), itself formed in a second well (62) of a second conductivity type (67) separated from the gate well of the thyristor, and the substrate; and the zener diode (Z) is formed in the second well (62).

5. The monolithic component of claim 4, formed from a substrate (1) of the first conductivity type, the rear surface of which is coated with a layer (2) of the second conductivity type coated with a first metallization (M1), and including, on its front surface side:

a first well (61) of the second conductivity type containing first (63), second (65), third (66), and fourth (67) regions of the first conductivity type, the first and second regions being separated by a portion of the first well coated with a first insulated gate metallization (G3), the third and fourth regions being separated by a portion of the first well coated with a second insulated gate metallization (G2), a portion at least of the first well separating the first (63) and/or the fourth (67) region from the substrate (1) including at its upper surface a first preformed channel region (64; 69) coated with a third insulated gate metallization (G1; G'1), a second metallization (M2) coating the first region (63), a third metallization (M3) coating the second (65) and third (66) regions and a portion of the upper surface of the first well, a fourth metallization (M4) coating the fourth region; and a second well (62) of the second conductivity type including fifth (71) and sixth (72) regions of the first conductivity type, the fifth region (71) being separated from the substrate by a second preformed channel region (73) coated with a fourth insulated gate metallization (G4), the sixth region (72) forming with the second well a zener junction, a fifth metallization (M5) coating the fifth and sixth regions and connecting them to the second well, a sixth metallization being in contact with a portion of the second well (62), a sixth metallization (M6) being in contact with a portion of the second well (62) neighboring the sixth region (72);

the second insulated gate metallization (G2) being meant to be connected to a control terminal (G), the second (M2), fourth (M4), and sixth (M6) metallizations as well as the third (G1) and fourth (G4) insulated gate metallizations being meant to be connected to a cathode terminal (K), the fifth metallization (M5) being connected to the first insulated gate metallization (G3) (node C).

6. The monolithic component of claim 3, wherein:

the thyristor (Th) is implemented in vertical form in a silicon substrate (1) of a first conductivity type;

the first depletion MOS transistor ($M_D1$) is formed in a third well (91) separated from the first cathode gate well (81) of the thyristor, between a region (92) formed in this third well and the substrate;

each of the second and third enhancement MOS transistors ($M_E2$, $M_E3$) is formed between a region (84; 85) of the first conductivity type, formed in the cathode gate well (81) of the thyristor, and the cathode region (83) of the thyristor;

the fourth depletion MOS transistor ($M_D4$) is formed between a region of the first conductivity type (71), itself formed in a second well (62) of the second conductivity type separated from the gate well of the thyristor, and the substrate;

the zener diode (Z) is formed in the second well (62); and the fifth P-channel depletion MOS transistor ($M_D5$) is formed between the second well (91) and an additional region (95) of the second conductivity type.

7. The monolithic component of claim 6, formed from a substrate (1) of the first conductivity type, the rear surface of which is coated with a layer (2) of the second conductivity type coated with a first metallization (M1) and including, on its front surface side:

a first well (81) of the second conductivity type containing first (83), second (84), and third regions (85) of the first conductivity type, the first and second regions being separated by a portion of the first well coated with a first insulated gate metallization (G2), the first and third regions being separated by a portion of the first well coated with a second insulated gate metallization (G3), the first region (83) being coated with a second metallization (M2), the second region (84) being coated with a third metallization (M7) extending over a portion of the first well, the third region (85) being coated with a fourth metallization (M8) extending over a portion of the first well;

a second well (62) of the second conductivity type including fourth (71) and fifth (72) regions of the first conductivity type, the fourth region (71) being separated from the substrate by a first preformed channel region (73) coated with a third insulated gate metallization (G4), the fifth region (72) forming with the second well a zener junction, a fifth metallization (M5) coating the fourth (71) and fifth (72) regions and connecting them to the second well (62), a sixth metallization (M6) being in contact with a portion of the second well (62) neighboring the fifth region (72); and a third well (91) of the second conductivity type containing a sixth region (92) of the first conductivity type, a portion at least of the well separating the sixth region (92) from the substrate (1) including at its upper surface a second preformed channel region (93) coated with a fourth insulated gate metallization (G1), the third well (91) being separated from a region (95) of the second conductivity type by a lightly-doped region (96) of the second conductivity type coated with a fifth insulated gate metallization (G5), the sixth region and a portion of the upper surface of the third well being coated with a seventh metallization (M9), the upper surface of the lightly-doped region (96) of the second conductivity type being coated with an eighth metallization (M10);

the first insulated gate metallization (G2) being meant to be connected to a control terminal (G), the second (M2), sixth (M6), and eighth (M10) metallizations as well as the third (G4) and fourth (G1) insulated gate metallizations being meant to be connected to a cathode terminal (K), the fifth metallization (M5) being connected to the second (G3) and fifth (G5) insulated gate metallizations (node C).

8. The monolithic component of claim 5, wherein each of the wells includes more heavily-doped areas at least at the locations where a metallization is in contact with a portion of their upper surface.

* * * * *